United States Patent
Tsai et al.

(10) Patent No.: US 11,547,026 B2
(45) Date of Patent: Jan. 3, 2023

(54) ELECTRIC VEHICLE AND POWER CONVERTER THEREOF

(71) Applicant: Delta Electronics, Inc., Taoyuan (TW)

(72) Inventors: Sheng-Nan Tsai, Taoyuan (TW); Ying-Chung Chuang, Taoyuan (TW); Chia-Jung Liu, Taoyuan (TW); Yi-Wei Chen, Taoyuan (TW); Han-Yu Tai, Taoyuan (TW); Shao-Hsiang Lo, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 6 days.

(21) Appl. No.: 17/220,092

(22) Filed: Apr. 1, 2021

(65) Prior Publication Data

US 2022/0087077 A1 Mar. 17, 2022

(30) Foreign Application Priority Data

Sep. 15, 2020 (CN) .......................... 202010969708.3

(51) Int. Cl.
*H05K 7/20* (2006.01)

(52) U.S. Cl.
CPC ..... *H05K 7/20927* (2013.01); *H05K 7/20872* (2013.01)

(58) Field of Classification Search
CPC .................... H05K 7/20872; H05K 7/20927
See application file for complete search history.

(56) References Cited

U.S. PATENT DOCUMENTS 8,081,463 B2 * 12/2011 Chiu-Mao .......... H05K 7/20218
174/15.1
10,164,373 B1 * 12/2018 Cheon .................. H01R 13/005
(Continued)

FOREIGN PATENT DOCUMENTS

CN 109413958 A 3/2019
EP 2557907 A1 * 2/2013 ......... H05K 7/20927
(Continued)

OTHER PUBLICATIONS

Extended Search Report of its corresponding EP application No. 21168536.7 (dated Oct. 7, 2021); pp. 1-11.
(Continued)

*Primary Examiner* — Robert J Hoffberg
(74) *Attorney, Agent, or Firm* — Muncy, Geissler, Olds & Lowe, P.C.

(57) ABSTRACT

A power converter is provided. The power converter includes a housing, a heat dissipation module, and a first circuit board. The housing forms a receiving space, wherein the housing includes a first housing port and a second housing port. The heat dissipation module is detachably connected to the housing, and disposed in the receiving space. The heat dissipation module includes an inner path that communicates the first housing port with the second housing port. Working fluid enters the inner path via the first housing port. The working fluid leaves the inner path via the second housing port. The first circuit board includes a first circuit board body and a first heat source, wherein the first heat source is disposed on the first circuit board body, and the first heat source is thermally connected to the inner path of the heat dissipation module.

11 Claims, 13 Drawing Sheets

(56) References Cited

U.S. PATENT DOCUMENTS

2015/0146375 A1    5/2015  Lu et al.
2016/0128236 A1    5/2016  Pietrantonio et al.
2022/0039297 A1*   2/2022  Smal .................. H05K 7/20927

FOREIGN PATENT DOCUMENTS

JP      2012120381 A    6/2012
KR       102077670 B1   2/2020

OTHER PUBLICATIONS

Taiwanese Office Action and Search Report of its corresponding TW application No. 109131595 (dated Nov. 19, 2021); pp. 1-10.

* cited by examiner

ELECTRIC VEHICLE AND POWER CONVERTER THEREOF

CROSS REFERENCE TO RELATED APPLICATIONS

This Application claims priority of China Patent Application No. 202010969708.3, filed on Sep. 15, 2020, the entirety of which is incorporated by reference herein.

BACKGROUND OF THE INVENTION

Field of the Invention

The present invention relates to a power converter, and in particular to a power converter with a heat dissipation module.

Description of the Related Art

The conventional power converter utilizes heat dissipation fins to remove heat. However, the power converter of the electric vehicle generates mass heat, and a water-cooled power converter is required.

In a conventional water-cooled power converter, the inner path and the housing of the power converter is integrally formed. The size of the housing of the power converter is increased. The welding apparatus and the production line cannot receive the power converter. Additionally, the main structure of the conventional power converter is made of metal, which decreases the temperature of welding, and the solder quality is deteriorated. The main housing has a side wall, and the side wall covers the solder and the hardware, and the solder quality and the hardware cannot be inspected. The conventional coolant channel is integrally formed with the main housing. The coolant channel can only have a two-dimensional design with limited heat dissipation area. The heat dissipation inside the housing cannot be sufficiently used. The heat dissipation structure cannot be modularized, and is unfavorable to the assembly process during mass production.

Additionally, in different conventional technologies, the solder joint may have residual stress and is easily broken.

BRIEF SUMMARY OF THE INVENTION

Embodiments of the invention are provided to address the aforementioned difficulty.

In one embodiment, a power converter is provided. The power converter includes a housing, a heat dissipation module, and a first circuit board. The housing forms a receiving space, wherein the housing comprises a first housing port and a second housing port. The heat dissipation module is detachably connected to the housing, and disposed in the receiving space, wherein the heat dissipation module comprises an inner path, the inner path communicates the first housing port with the second housing port, a working fluid enters the inner path via the first housing port, and the working fluid leaves the inner path via the second housing port. The first circuit board includes a first circuit board body and a first heat source, wherein the first heat source is disposed on the first circuit board body, and the first heat source is thermally connected to the inner path of the heat dissipation module.

In one embodiment, the heat dissipation module comprises a first inner path port and a second inner path port, the first inner path port corresponds to the first housing port, the second inner path port corresponds to the second housing port, the heat dissipation module is disposed in the housing in a first direction, the first inner path port is connected to the first housing port in the first direction, and the second inner path port is connected to the second housing port in the first direction.

In one embodiment, the power converter further comprises a fastening member, wherein the housing comprises at least one housing fastening portion, the heat dissipation module comprises at least one module fastening portion, and the fastening member affixes the module fastening portion to the housing fastening portion in the first direction.

In one embodiment, the power converter further comprises a second circuit board, wherein the second circuit board comprises a second circuit board body and a second heat source, the second heat source is disposed on the second circuit board body, and the second heat source is thermally connected to the inner path of the heat dissipation module, the first circuit board is connected to the first side of the heat dissipation module, the second circuit board is connected to the second side of the heat dissipation module, and the first side is opposite to the second side.

In one embodiment, the heat dissipation module comprises a module receiving groove, and the first heat source is disposed in the module receiving groove to be thermally connected to the heat dissipation module.

In one embodiment, the first heat source comprises a transformer.

In one embodiment, the first circuit board comprises a capacitor, the capacitor is connected to the first circuit board body, the heat dissipation module comprises an annular connection portion, and the capacitor is connected to the annular connection portion to be thermally connected to the heat dissipation module.

In one embodiment, the first circuit board further comprises a transistor, the transistor is connected to the first circuit board body, the heat dissipation module comprises an elastic sheet and a stopping wall, the elastic sheet pushes the transistor, the transistor abuts the stopping wall, and the transistor is thermally connected to the heat dissipation module.

In one embodiment, the power converter further comprises a third circuit board, wherein the third circuit board comprises a third circuit board body and a third heat source, the third circuit board body comprises a circuit board opening, the heat dissipation module comprises a module protrusion, the module protrusion passes through the circuit board opening to be connected to the third heat source.

In one embodiment, the third heat source comprises an inductor.

In one embodiment, the heat dissipation module further comprises a module protrusion, the second heat source is connected to the module protrusion, and the second heat source is thermally connected to the heat dissipation module, and the second heat source is located between the second circuit board body and the heat dissipation module.

In one embodiment, the heat dissipation module comprises a first module unit, a second module unit, and a third module unit, the second module unit overlaps the first module unit, the third module unit overlaps the first module unit, the inner path passes through the first module unit, the second module unit, and the third module unit.

In one embodiment, the height of the third module unit relative the first module unit is lower than the height of the second module unit relative the first module unit.

In one embodiment, the working fluid enters the first module unit first; then, the working fluid passes through the first module unit to enter the second module unit; next, the working fluid passes the second module unit to enter the third module unit; and finally the working fluid leaves the third module unit.

In one embodiment, the heat dissipation module comprises a first pipe, a second pipe, and a third pipe, the first housing port is connected to the first module unit, the first pipe connects the first module unit to the second module unit, the second pipe connects the second module unit to the third module unit, and the third pipe connects the third module unit to the second housing port.

In one embodiment, the first module unit comprises a structure notch, and the third pipe passes through the structure notch.

In one embodiment, the power converter further comprises a fourth circuit board and a fifth circuit board, wherein the first circuit board is thermally connected to the first module unit, the fourth circuit board is thermally connected to the second module unit, and the fifth circuit board is thermally connected to the third module unit.

In one embodiment, an electric vehicle is provided. The electric vehicle includes a cooling system and a power converter. A working fluid flows cyclically through the cooling system to transmit heat. The power converter includes a housing, a heat dissipation module, and a first circuit board. The housing forms a receiving space, wherein the housing comprises a first housing port and a second housing port. The heat dissipation module is detachably connected to the housing, and disposed in the receiving space, wherein the heat dissipation module comprises an inner path, the inner path communicates the first housing port with the second housing port, the working fluid enters the inner path via the first housing port, and the working fluid leaves the inner path via the second housing port. The first circuit board comprises a first circuit board body and a first heat source, wherein the first heat source is disposed on the first circuit board body, and the first heat source is thermally connected to the inner path of the heat dissipation module.

In the power converter of the embodiments of the invention, the housing and the heat dissipation module are manufactured independently. The heat dissipation module can be combined to the first circuit board first, and then be assembled to the housing. The heat dissipation space on the heat dissipation module can be sufficiently used due to the segmented assembly process. After the heat dissipation module is assembled to the housing, the combination of the first circuit board to the heat dissipation module can be checked. The producing efficiency and reliability of the power converter are improved. Additionally, the circuit board and the heat dissipation module can be combined by welding. The size of the whole power converter is reduced, and the ratio of the metal structure is decreased. Compared to the convention art, the welding apparatus and the production line can receive the circuit board and the heat dissipation module easily. The space utilization and welding efficiency of the welding apparatus are improved. The problem of broken solder can be reduced. The solder quality can be easily inspected, and the hardware circuit can be detected and debugged.

Additionally, in another embodiment, the heat dissipation module can comprises a plurality of module units. The module units compose a three-dimensional inner path. The heat dissipation area is increased. In another embodiment, the housing can be made of engineering plastic to reduce weight.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
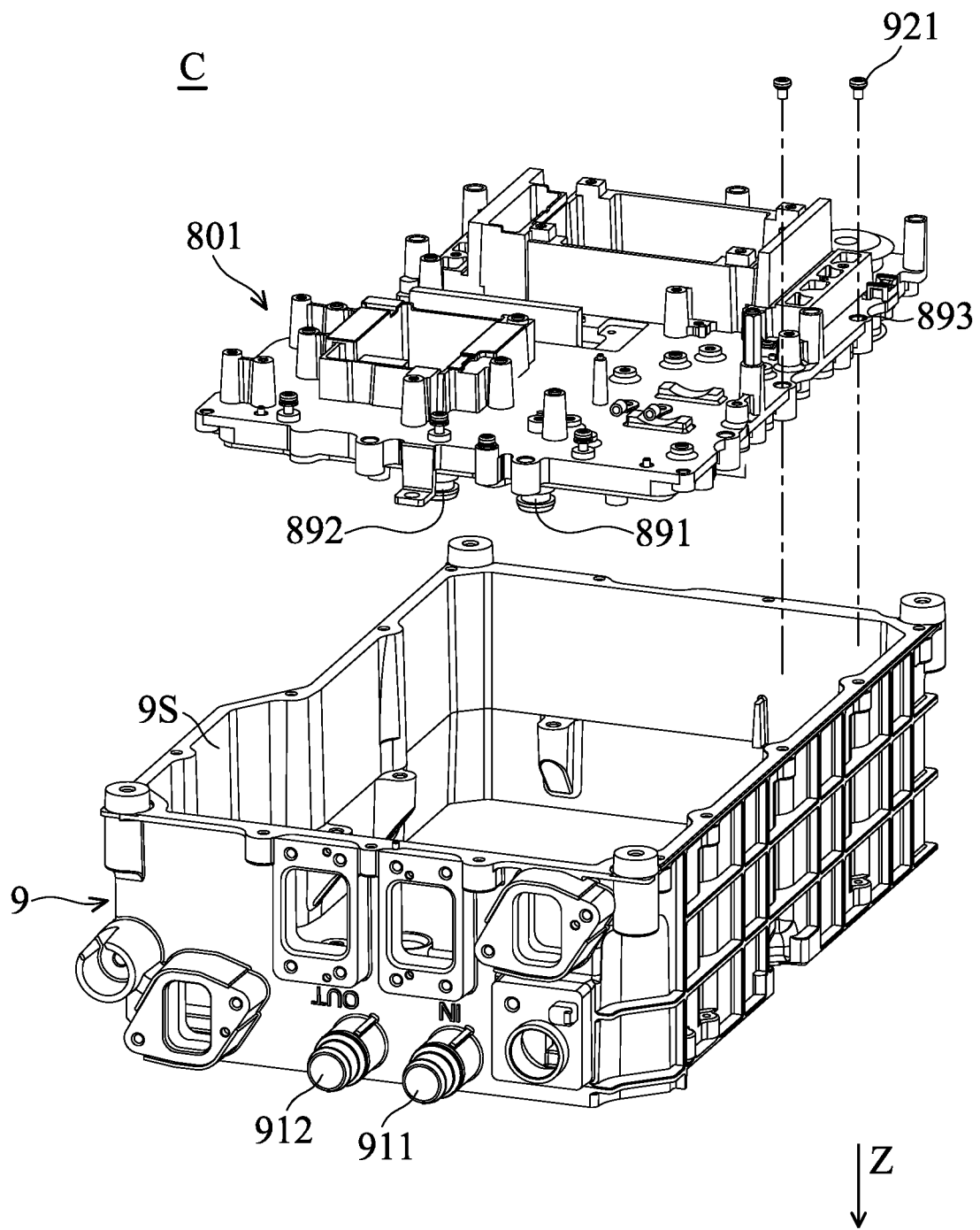
FIG. 1A shows a portion of a power converter of a first embodiment of the invention.
Figure 1B:
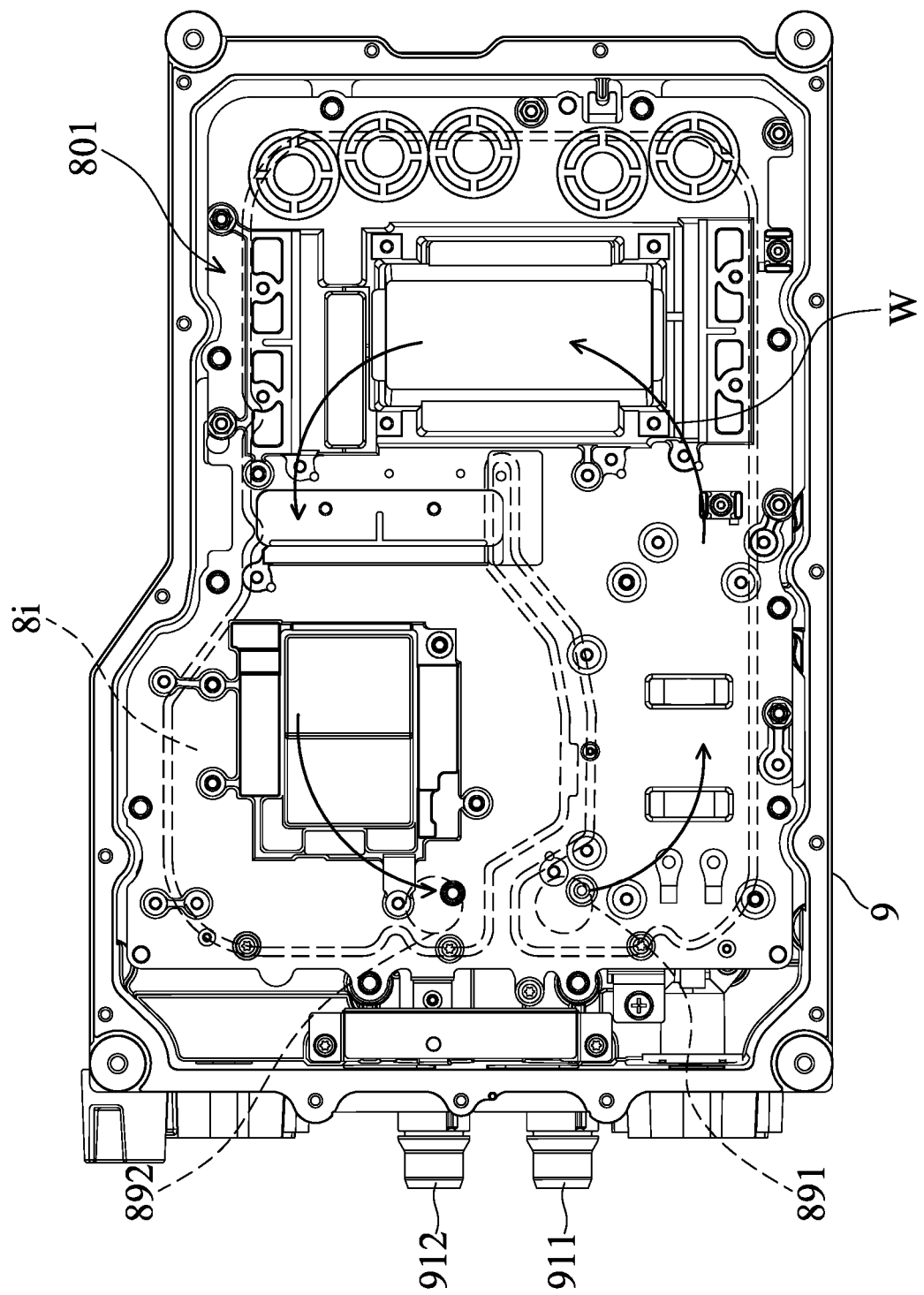
FIG. 1B shows an inner path of the power converter of the first embodiment of the invention.

FIG. 1A shows a portion of a power converter of a first embodiment of the invention. FIG. 1B shows an inner path of the power converter of the first embodiment of the invention. With reference to FIGS. 1A and 1B, the power converter C of the embodiment of the invention includes a housing 9 and a heat dissipation module 801. The housing 9 forms a receiving space 9S. The housing 9 comprises a first housing port 911 and a second housing port 912. The heat dissipation module 801 is detachably connected to the housing 9, and is adapted to be disposed in the receiving space 9S. The heat dissipation module 801 comprises an inner path 8i. The inner path 8i communicates the first housing port 911 with the second housing port 912. A working fluid W enters the inner path 8i via the first housing port 911, and the working fluid W leaves the inner path 8i via the second housing port 912.

With reference to FIGS. 1A and 1B, in one embodiment, the heat dissipation module 801 comprises a first inner path port 891 and a second inner path port 892. The first inner path port 891 corresponds to the first housing port 911. The second inner path port 892 corresponds to the second housing port 912. The heat dissipation module 801 is disposed in the housing 9 in a first direction Z. The first inner path port 891 is connected to the first housing port 911 in the first direction Z, and the second inner path port 892 is connected to the second housing port 912 in the first direction Z.

Figure 1C:
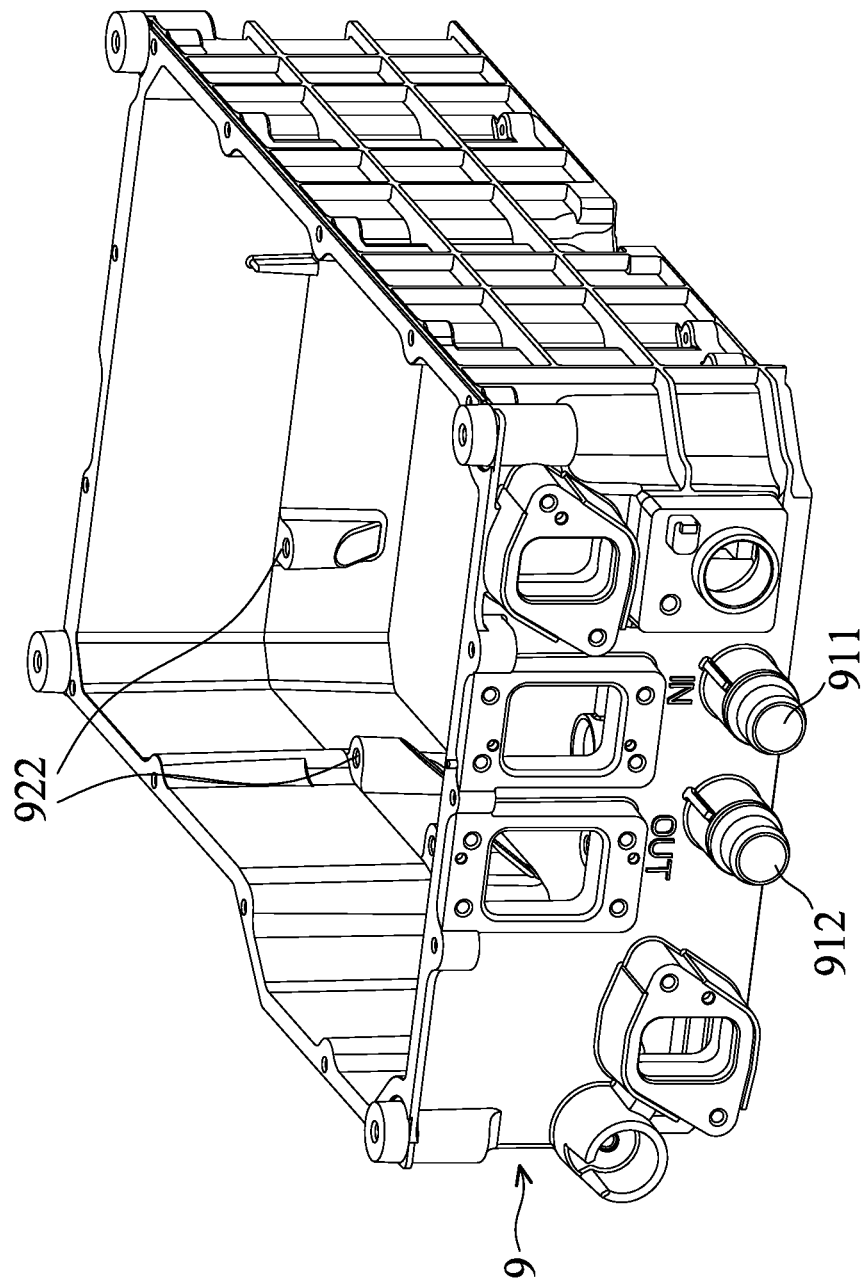
FIG. 1C shows the details of the housing of the embodiment of the invention.

FIG. 1C shows the details of the housing of the embodiment of the invention. With reference to FIGS. 1A and 1C, in one embodiment, the power converter C further comprises a fastening member 921. The housing 9 comprises at least one housing fastening portion 922. The heat dissipation module 801 comprises at least one module fastening portion 893. The fastening member 921 affixes the module fastening portion 893 to the housing fastening portion 922 in the first direction Z.

Figure 2A:
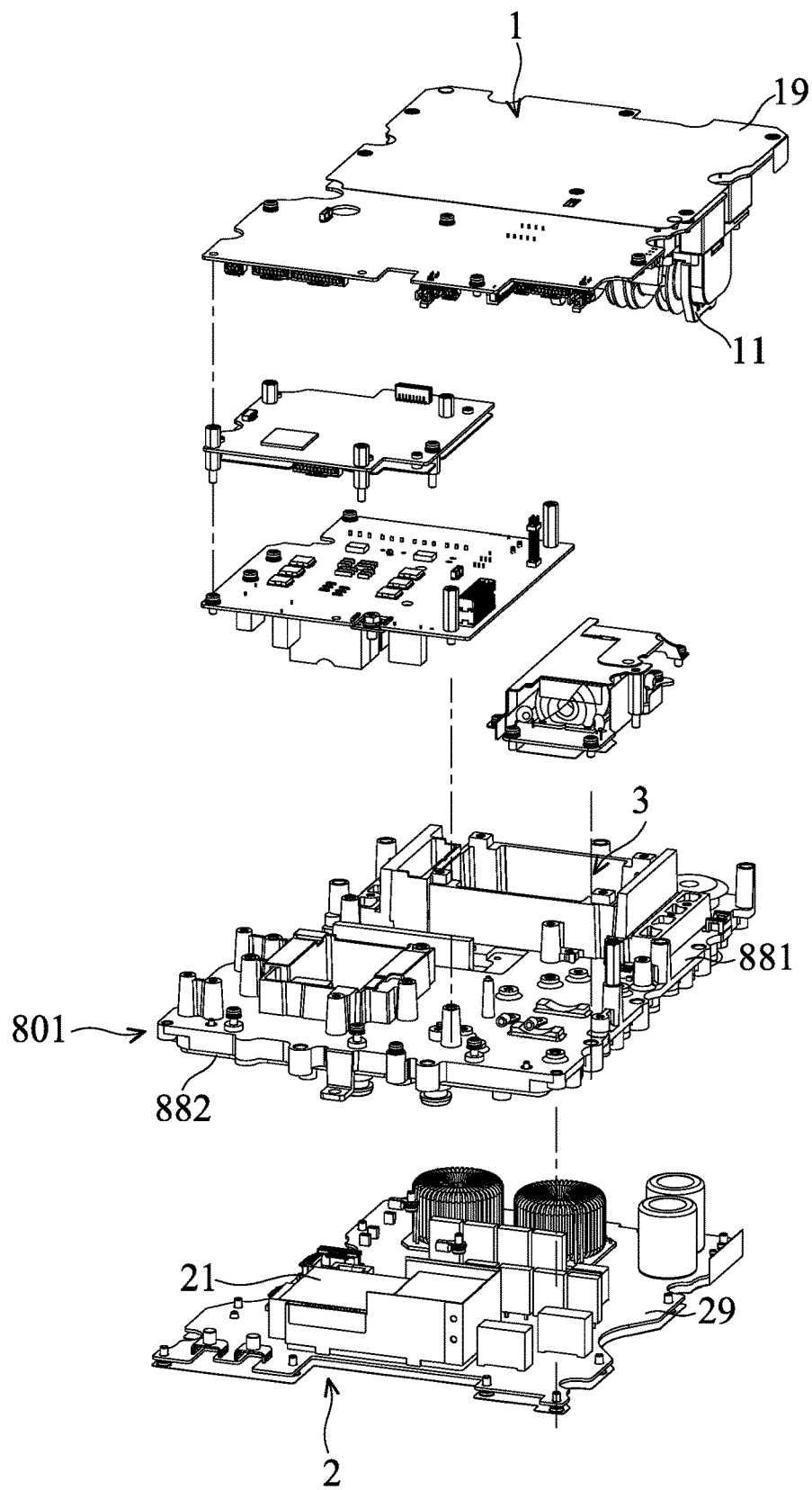
FIG. 2A is an exploded view of a portion of the power converter of the first embodiment of the invention.
Figure 2B:
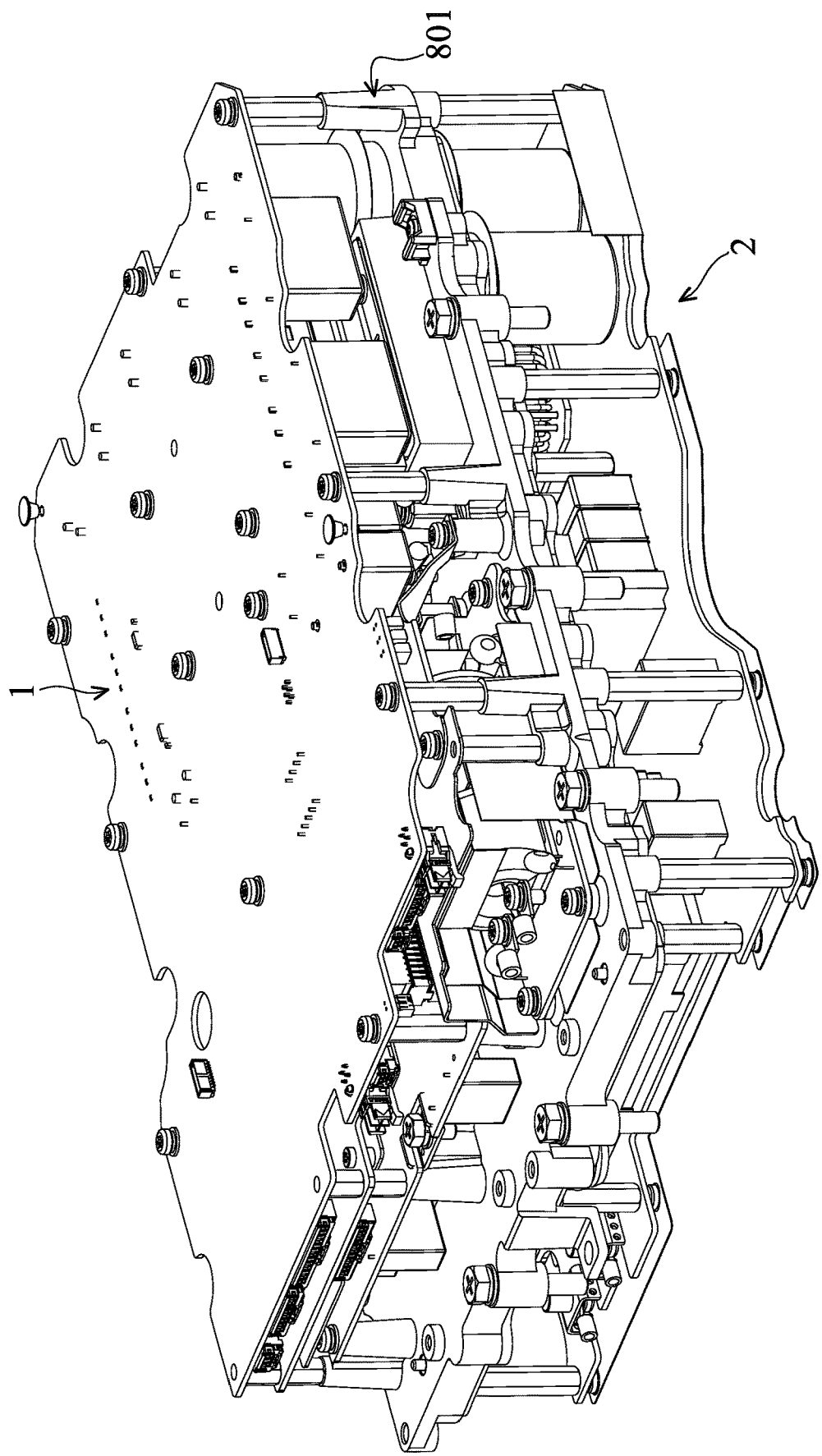
FIG. 2B is an assembled view of a portion of the power converter of the first embodiment of the invention.

FIG. 2A is an exploded view of a portion of the power converter of the first embodiment of the invention. FIG. 2B is an assembled view of a portion of the power converter of the first embodiment of the invention. With reference to FIGS. 2A and 2B, in one embodiment, the power converter C comprises a first circuit board 1. The first circuit board 1 includes a first circuit board body 19 and a first heat source 11. The first heat source 11 is disposed on the first circuit board body 19. The first heat source 11 is thermally connected to the inner path 8i of the heat dissipation module 801.

With reference to FIGS. 2A and 2B, in one embodiment, the power converter C further comprises a second circuit board 2. The second circuit board 2 comprises a second circuit board body 29 and a second heat source 21. The second heat source 21 is disposed on the second circuit board body 29. The second heat source 21 is thermally connected to the inner path of the heat dissipation module 801. The first circuit board 1 is connected to a first side 881 of the heat dissipation module 801. The second circuit board 2 is connected to a second side 882 of the heat dissipation module 801, and the first side 881 is opposite to the second side 882.

Figure 3A:
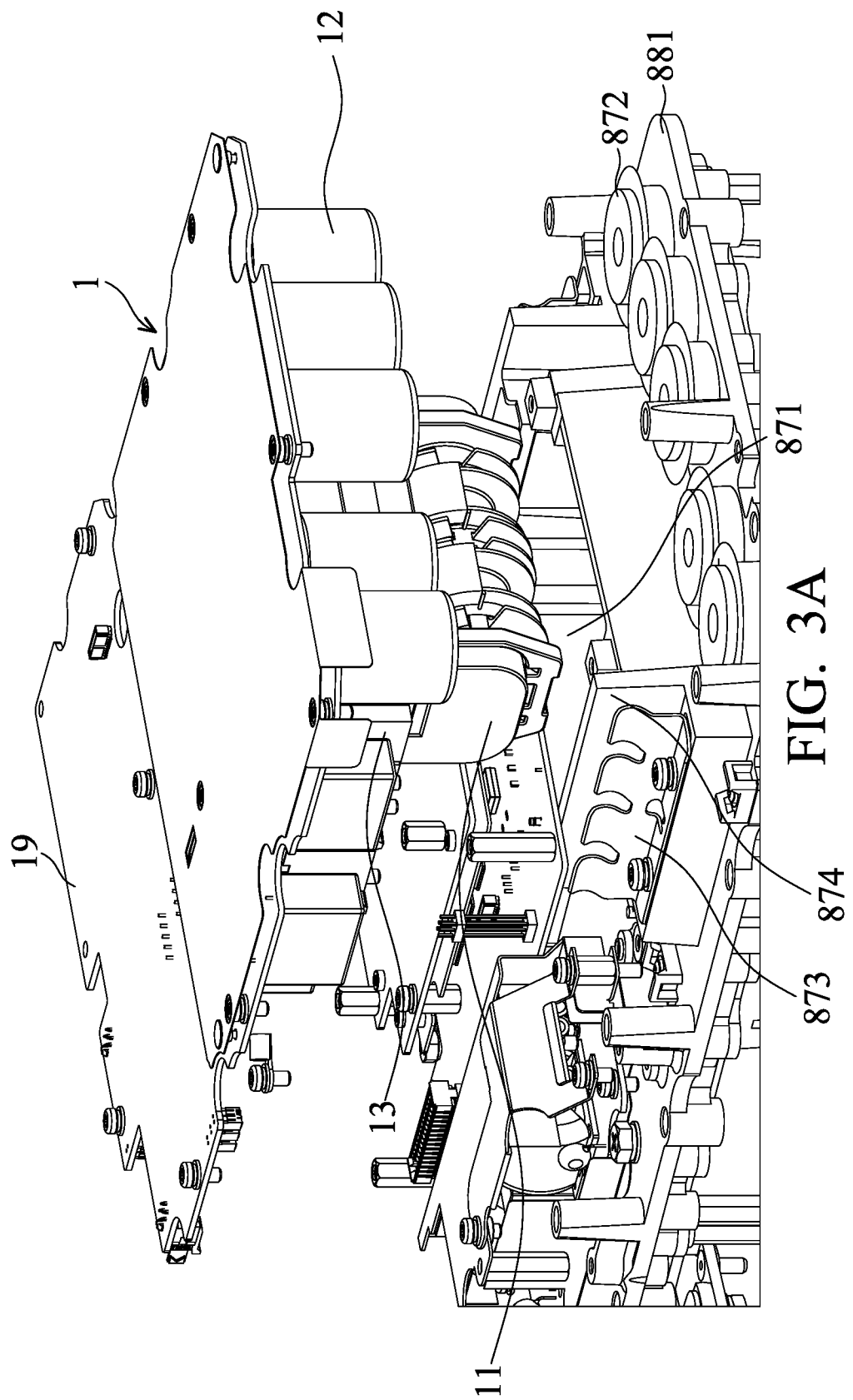
FIG. 3A shows the details of the first circuit board and the heat dissipation module of the embodiment of the invention.

FIG. 3A shows the details of the first circuit board and the heat dissipation module of the embodiment of the invention. With reference to FIG. 3A, in one embodiment, the heat dissipation module 801 comprises a module receiving groove 871. The first heat source 11 is disposed in the module receiving groove 871 to be thermally connected to the heat dissipation module 801. In one embodiment, the first heat source 11 comprises a transformer.

With reference to FIG. 3A, in one embodiment, the first circuit board 1 comprises a capacitor 12. The capacitor 12 is connected to the first circuit board body 19. The heat dissipation module 801 comprises an annular connection portion 872, and the capacitor 12 is connected to the annular connection portion 872 to be thermally connected to the heat dissipation module.

With reference to FIG. 3A, in one embodiment, the first circuit board 1 further comprises a transistor 13. The transistor 13 is connected to the first circuit board body 19. The heat dissipation module 801 comprises an elastic sheet 873 and a stopping wall 874. The elastic sheet 873 pushes the transistor 13. The transistor 13 abuts the stopping wall 874. The transistor 13 is thermally connected to the heat dissipation module 801.

Figure 3B:
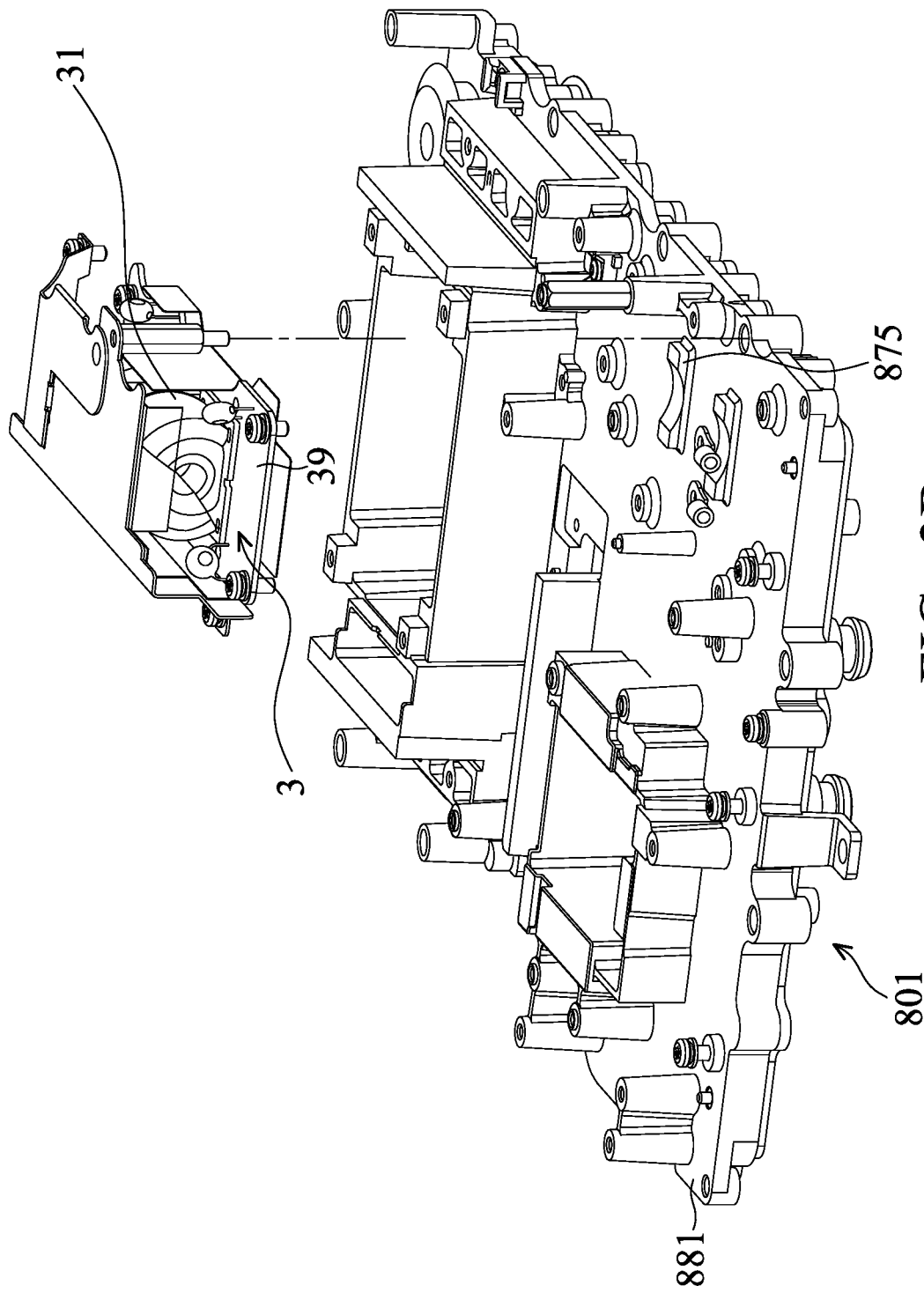
FIGS. 3B and 3C show the details of the third circuit board and the heat dissipation module of the embodiment of the invention.
Figure 3C:
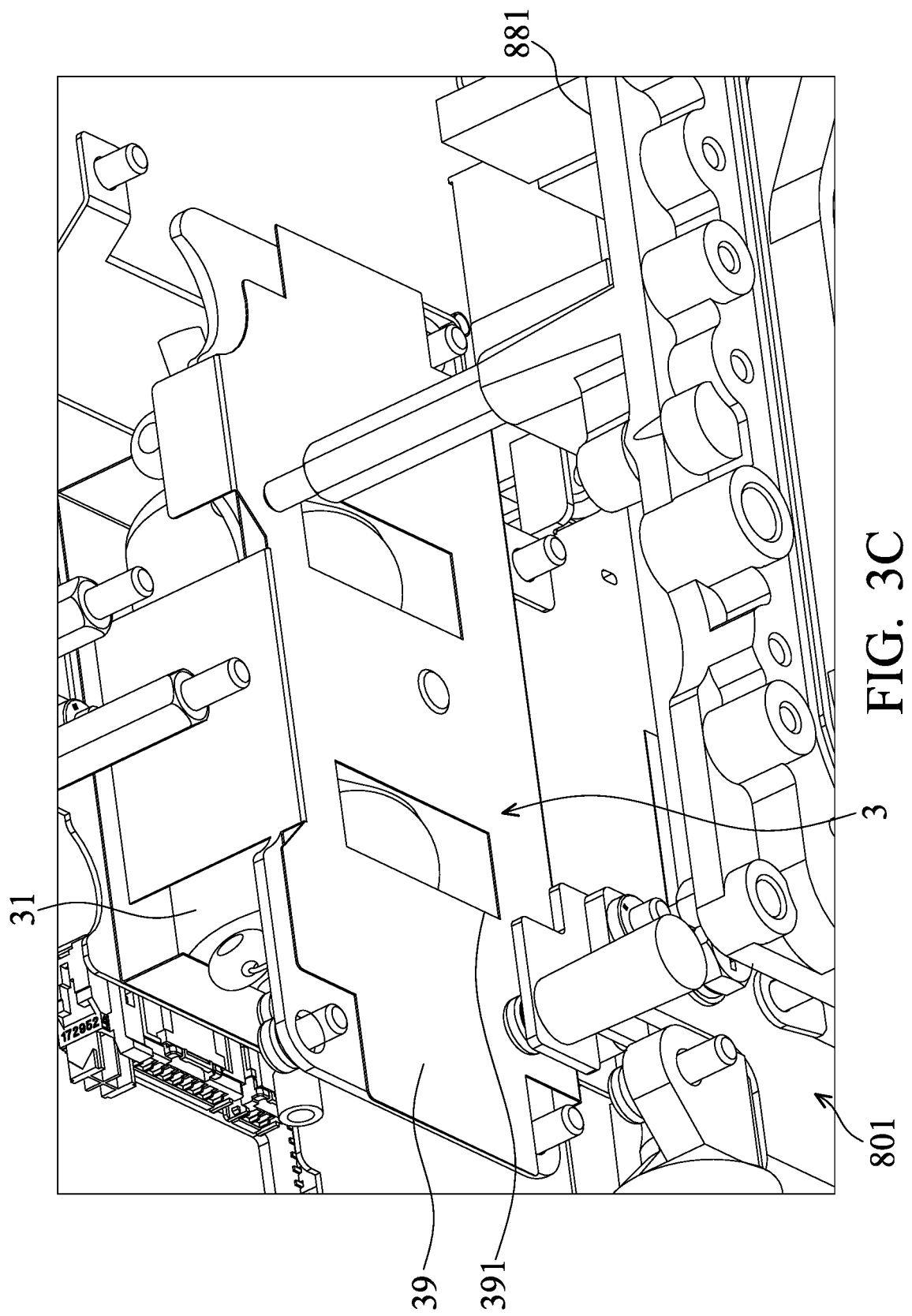

FIGS. 3B and 3C show the details of the third circuit board and the heat dissipation module of the embodiment of the invention. With reference to FIGS. 3B and 3C, in one embodiment, the power converter further comprises a third circuit board 3. The third circuit board 3 comprises a third circuit board body 39 and a third heat source 31. The third circuit board body 39 comprises a circuit board opening 391. The heat dissipation module 801 comprises a module protrusion 875. The module protrusion 875 passes through the circuit board opening 391 to be connected to the third heat source 31. The third heat source 31 is thus thermally connected to the heat dissipation module 801. In one embodiment, the third heat source 31 comprises an inductor.

Figure 4A:
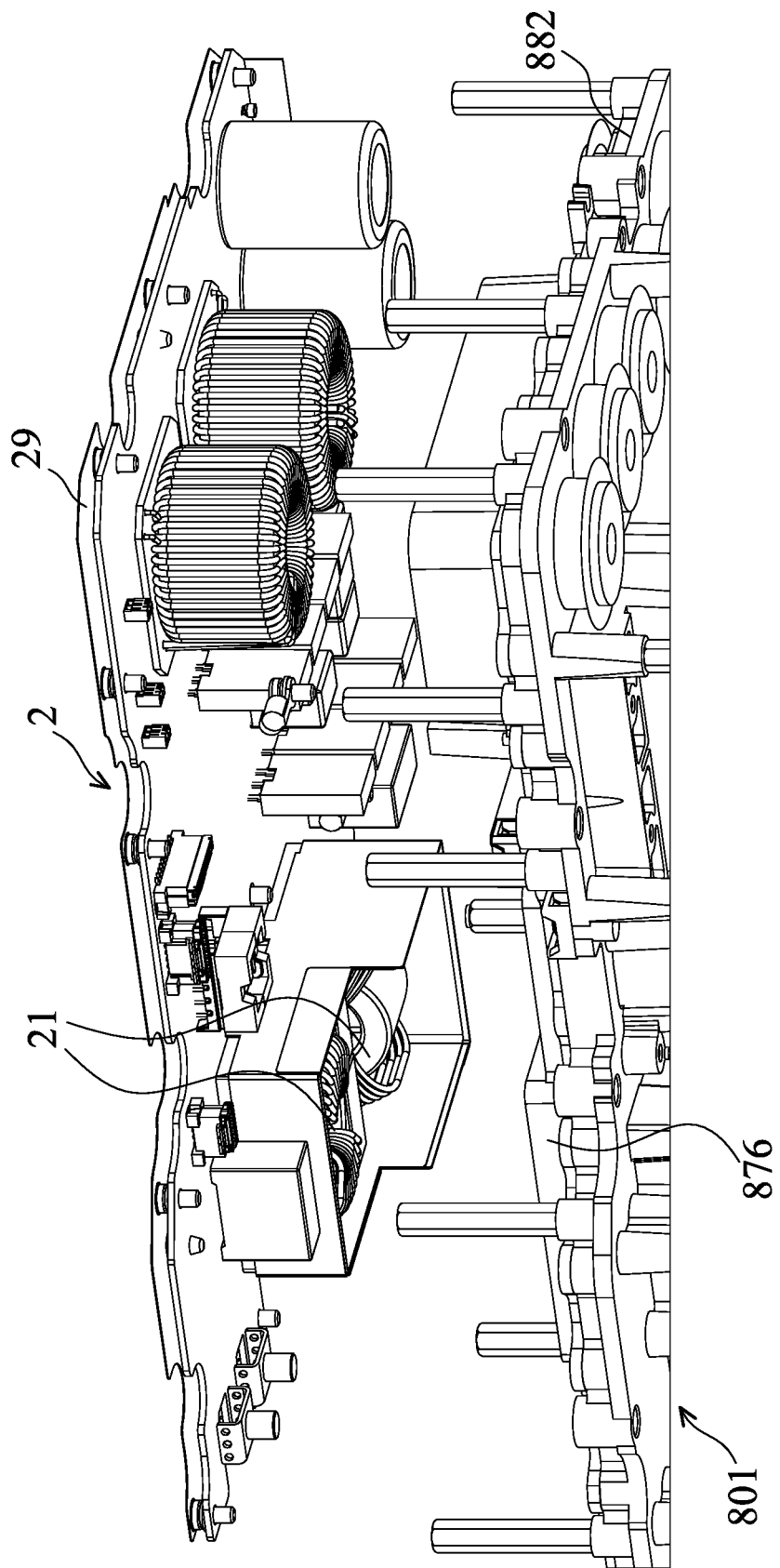
FIGS. 4A and 4B show the details of the second circuit board and the heat dissipation module of the embodiment of the invention.
Figure 4B:
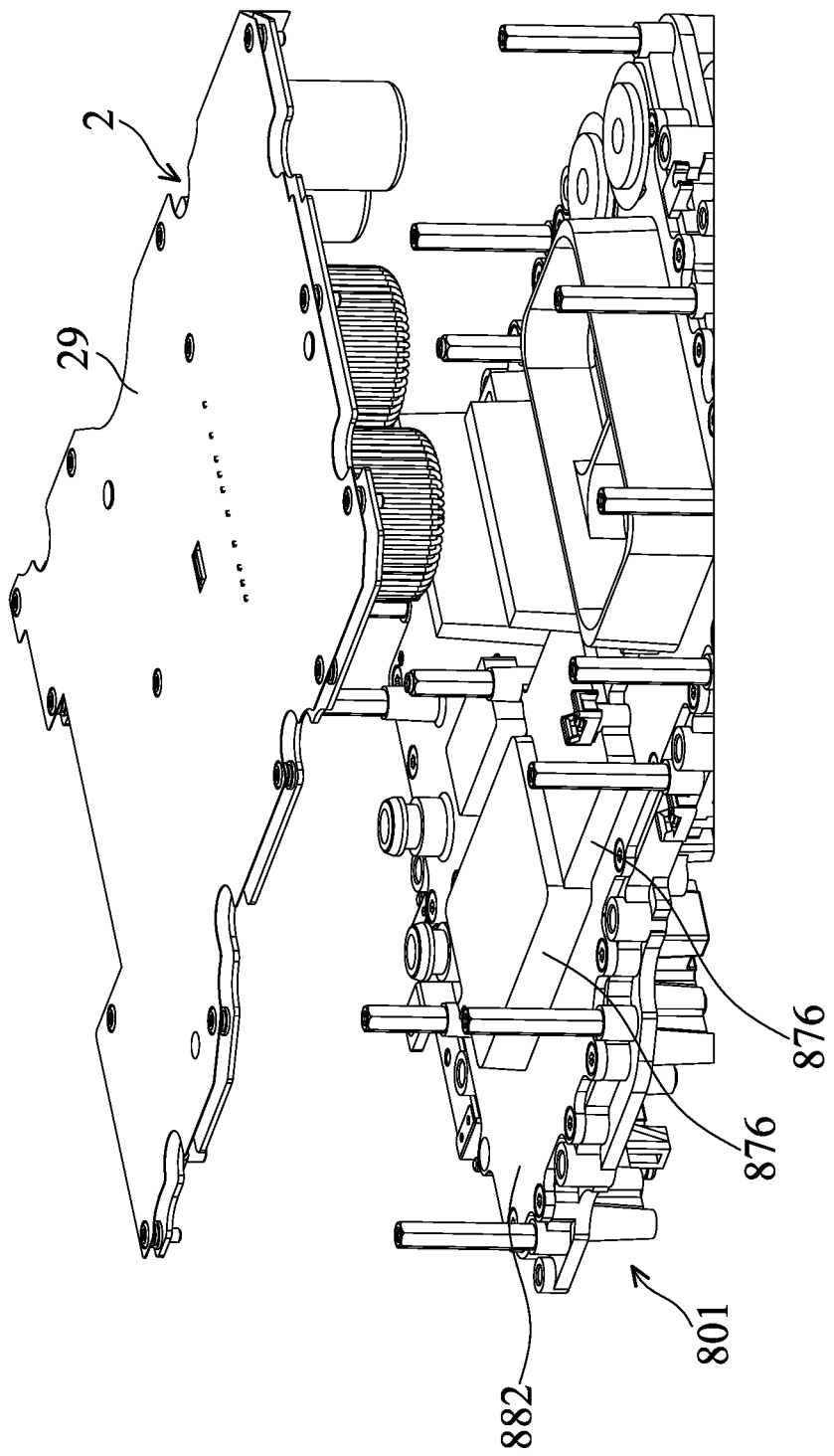

FIGS. 4A and 4B show the details of the second circuit board and the heat dissipation module of the embodiment of the invention. With reference to FIGS. 4A and 4B, in one embodiment, the heat dissipation module 801 further comprises a module protrusion 876. The second heat source 21 is connected to the module protrusion 876. The second heat source 21 is thermally connected to the heat dissipation module 801. The second heat source 21 is located between the second circuit board body 29 and the heat dissipation module 801.

With reference to FIG. 1B, in the first embodiment, the working fluid W enters the inner path 8i via the first housing port 911 and the first inner path port 891. When the working fluid W travels in the inner path 8i, the working fluid W removes heat of the heat sources mentioned above from the heat dissipation module 801. The working fluid W leaves the inner path 8i via the second inner path port 892, and leaves the power converter via the second housing port 912.

Figure 5A:
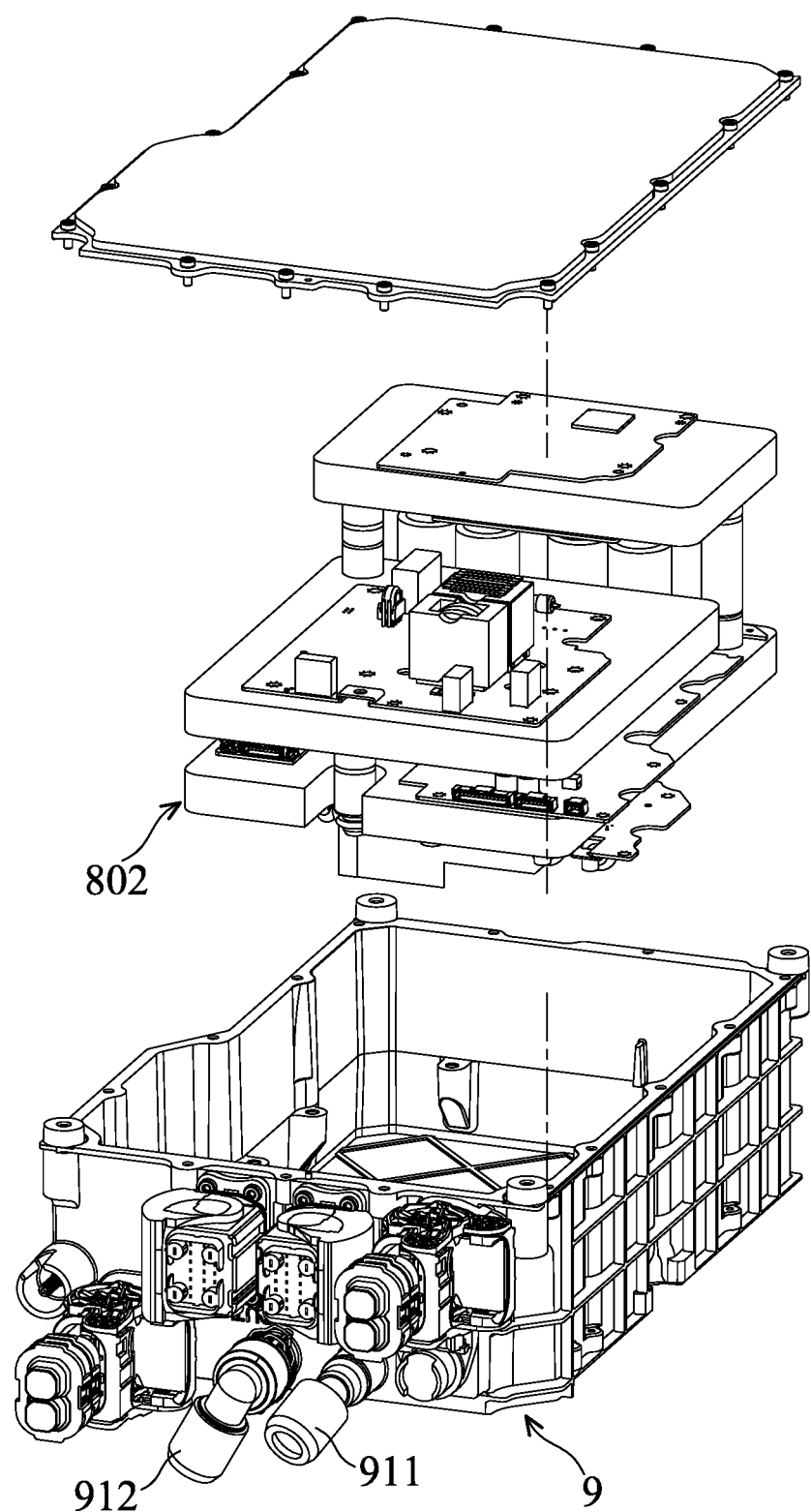
FIG. 5A is an exploded view of a portion of the power converter of a second embodiment of the invention.
Figure 5B:
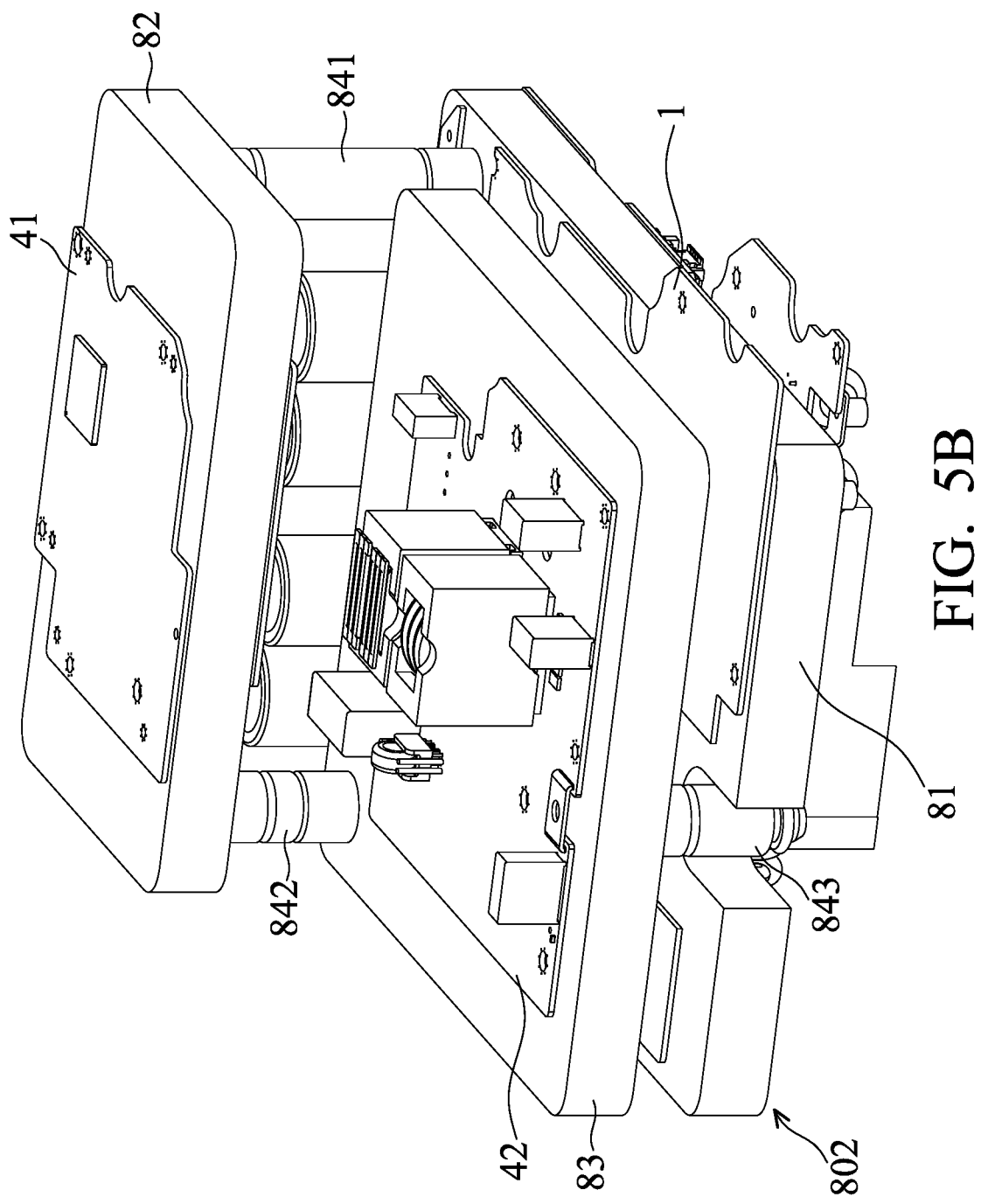
FIG. 5B is an assembled view of a heat dissipation module of the second embodiment of the invention.
Figure 5C:
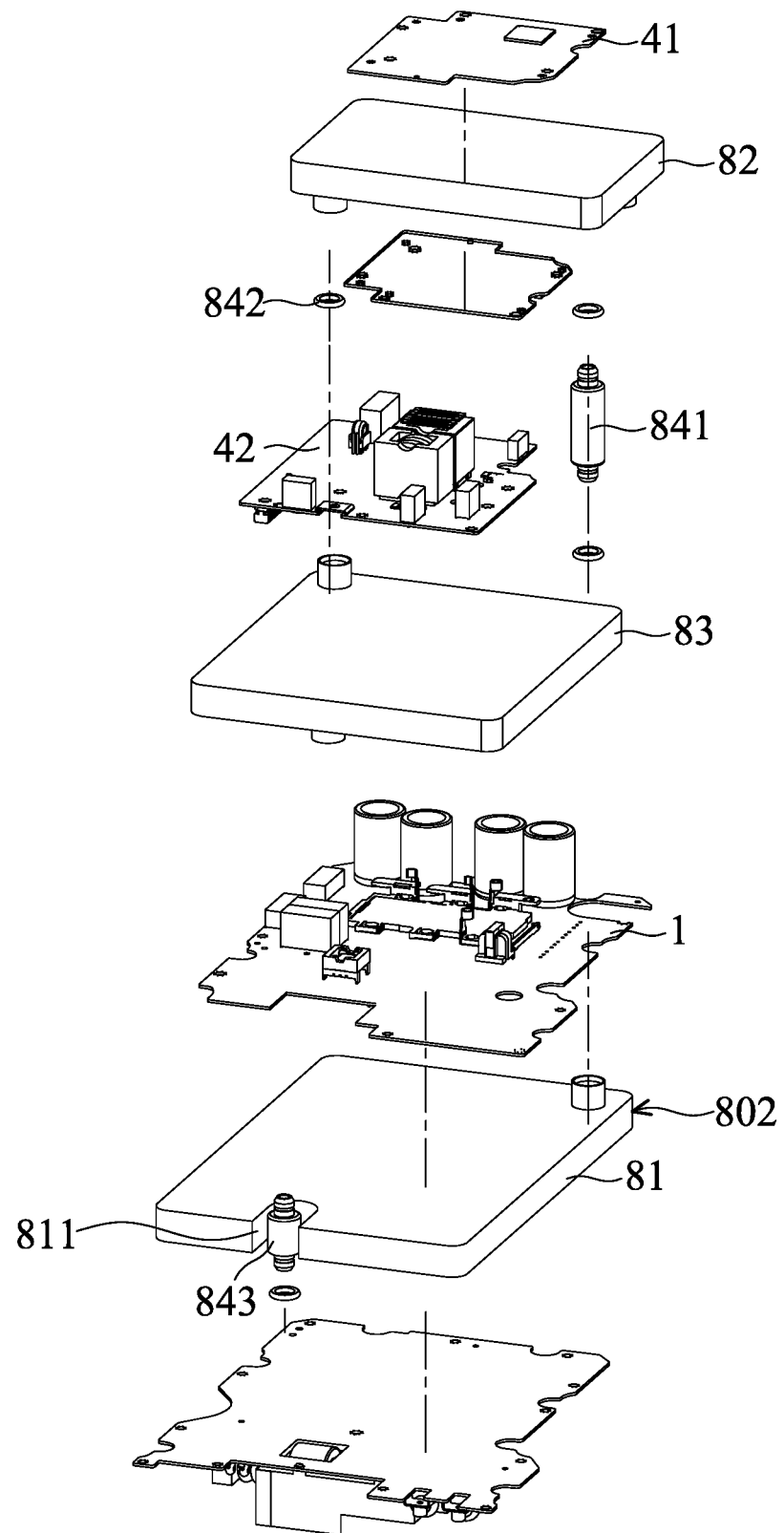
FIG. 5C is an exploded view of the heat dissipation module of the second embodiment of the invention.

FIG. 5A is an exploded view of a portion of the power converter of a second embodiment of the invention. FIG. 5B is an assembled view of a heat dissipation module of the second embodiment of the invention. FIG. 5C is an exploded view of the heat dissipation module of the second embodiment of the invention. With reference to FIGS. 5A, 5B and 5C, in the second embodiment of the invention, the heat dissipation module 802 comprises a first module unit 81, a second module unit 82 and a third module unit 83. The second module unit 82 overlaps the first module unit 81. The third module unit 83 overlaps the first module unit 81. The inner path passes through the first module unit 81, the second module unit 82 and the third module unit 83.

With reference to FIGS. 5A, 5B and 5C, in one embodiment, the height of the third module unit 83 relative the first module unit 81 is lower than the height of the second module unit 82 relative the first module unit 81.

With reference to FIGS. 5A, 5B and 5C, in one embodiment, the heat dissipation module 802 comprises a first pipe 841, a second pipe 842 and a third pipe 843. The first housing port 911 is connected to the first module unit 81. The first pipe 841 connects the first module unit 81 to the second module unit 82. The second pipe 842 connects the second module unit 82 to the third module unit 83. The third pipe 843 connects the third module unit 83 to the second housing port 912.

With reference to FIGS. 5A, 5B and 5C, in one embodiment, the first module unit 81 comprises a structure notch 811. The third pipe 843 passes through the structure notch 811.

With reference to FIGS. 5A, 5B and 5C, in one embodiment, the power converter further comprises a fourth circuit board 41 and a fifth circuit board 42. The first circuit board 1 is thermally connected to the first module unit 81. The fourth circuit board 41 is thermally connected to the second module unit 82. The fifth circuit board 42 is thermally connected to the third module unit 83.

With reference to FIGS. 5A, 5B and 5C, in one embodiment, the working fluid (not shown) enters the first module unit 81 first. Then, the working fluid passes through the first module unit 81 to enter the second module unit 82 via the first pipe 841. Next, the working fluid passes the second module unit 842 to enter the third module unit 83 via the second pipe 842. Finally, the working fluid leaves the third module unit 83 via the third pipe 843, and therefore leaves the heat dissipation module 802. The working fluid removes heat of the heat sources mentioned above from the heat dissipation module 802.

In the power converter of the embodiments of the invention, the housing and the heat dissipation module are manufactured independently. The heat dissipation module can be combined to the first circuit board first, and then be assembled to the housing. The heat dissipation space on the heat dissipation module can be sufficiently used due to the segmented assembly process. After the heat dissipation module is assembled to the housing, the combination of the first circuit board to the heat dissipation module can be checked. The producing efficiency and reliability of the power converter are improved. Additionally, the circuit board and the heat dissipation module can be combined by welding. The size of the whole power converter is reduced, and the ratio of the metal structure is decreased. Compared to the convention art, the welding apparatus and the production line can receive the circuit board and the heat dissipation module easily. The space utilization and welding efficiency of the welding apparatus are improved. The problem of broken solder can be reduced. The solder quality can be easily inspected, and the hardware circuit can be detected and debugged.

Additionally, in another embodiment, the heat dissipation module can comprise a plurality of module units. The module units compose a three-dimensional inner path. The heat dissipation area is increased. In another embodiment, the housing can be made of engineering plastic to reduce weight.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A power converter, comprising:
   a housing, forming a receiving space, wherein the housing comprises a first housing port and a second housing port each passing through a wall of the housing, first ends of the first and second housing ports disposed along a first axis passing through the wall and facing away from the receiving space, and an opposing second ends of the first and second housing ports disposed along a second axis and facing toward the receiving space, the second axis perpendicular to the first axis;
   a heat dissipation module disposed within the receiving space of the housing, the heat dissipation module configured to detachably connected to the housing along the second axis, wherein the heat dissipation module comprises:
      an inner path, the inner path communicates the first housing port with the second housing port,
      a first inner path port at a first end of the inner path, the first inner path port disposed along the second axis and connected to the second end of the first housing port, and
      a second inner path port at an opposing second end of the inner path, the second inner path port disposed along the second axis and connected to the second housing port,
   a working fluid enters a first end of the first housing port along the first axis, changes direction to leave a second end of the first housing port along the second axis, enters the first inner path port along the second axis, flows through the inner path, leaves the second inner path port along the second axis, enters the second end of the second housing port along the second axis, and changes direction to leave the end of the second housing port along the first axis; and
   a first circuit board disposed within the receiving space of the housing, the first circuit board comprising a first circuit board body and a first heat source, wherein the first heat source is disposed on the first circuit board body, and the first heat source is thermally connected to the inner path of the heat dissipation module.

2. The power converter as claimed in claim 1, further comprising a fastening member, wherein the housing comprises at least one housing fastening portion, the heat dissipation module comprises at least one module fastening portion, and the fastening member affixes the module fastening portion to the housing fastening portion in the second axis.

3. The power converter as claimed in claim 1, further comprising a second circuit board, wherein the second circuit board comprises a second circuit board body and a second heat source, the second heat source is disposed on the second circuit board body, and the second heat source is thermally connected to the inner path of the heat dissipation module, the first circuit board is connected to a first side of the heat dissipation module, the second circuit board is connected to a second side of the heat dissipation module, and the first side is opposite to the second side.

4. The power converter as claimed in claim 3, further comprising a third circuit board, wherein the third circuit board comprises a third circuit board body and a third heat source, the third circuit board body comprises a circuit board opening, the heat dissipation module further comprises a module protrusion, the module protrusion passes through the circuit board opening to be connected to the third heat source.

5. The power converter as claimed in claim 4, wherein the third heat source comprises an inductor.

6. The power converter as claimed in claim 3, wherein the heat dissipation module further comprises a module protrusion, the second heat source is connected to the module protrusion, and the second heat source is thermally connected to the heat dissipation module, and the second heat source is located between the second circuit board body and the heat dissipation module.

7. The power converter as claimed in claim 1, wherein the heat dissipation module further comprises a module receiving groove, and the first heat source is disposed in the module receiving groove to be thermally connected to the heat dissipation module.

8. The power converter as claimed in claim 1, wherein the first heat source comprises a transformer.

9. The power converter as claimed in claim 1, wherein the first circuit board comprises a capacitor, the capacitor is connected to the first circuit board body, the heat dissipation module further comprises an annular connection portion, and the capacitor is connected to the annular connection portion to be thermally connected to the heat dissipation module.

10. The power converter as claimed in claim 1, wherein the first circuit board further comprises a transistor, the transistor is connected to the first circuit board body, the heat dissipation module further comprises an elastic sheet and a stopping wall, the elastic sheet pushes the transistor, the transistor abuts the stopping wall, and the transistor is thermally connected to the heat dissipation module.

11. An electric vehicle, comprising:
- a cooling system, wherein a working fluid flows cyclically through the cooling system to transmit heat; and
- a power converter, comprising:
- a housing, forming a receiving space, wherein the housing comprises a first housing port and a second housing port each passing through a wall of the housing, first ends of the first and second housing ports disposed along a first axis passing through the wall and facing away from the receiving space, and an opposing second ends of the first and second housing ports disposed along a second axis and facing toward the receiving space, the second axis perpendicular to the first axis;
- a heat dissipation module disposed within the receiving space of the housing, the heat dissipation module configured to detachably connected to the housing along the second axis, wherein the heat dissipation module comprises:
  - an inner path, the inner path communicates the first housing port with the second housing port,
  - a first inner path port at a first end of the inner path, the first inner path port disposed along the second axis and connected to the second end of the first housing port, and
  - a second inner path port at an opposing second end of the inner path, the second inner path port disposed along the second axis and connected to the second housing port,
- the working fluid enters a first end of the first housing port along the first axis, changes direction to leave a second end of the first housing port along the second axis, enters the first inner path port along the second axis, flows through the inner path, leaves the second inner path port along the second axis, enters the second end of the second housing port along the second axis, and changes direction to leave the end of the second housing port along the first axis; and
- a first circuit board disposed within the receiving space of the housing, the first circuit board comprising a first circuit board body and a first heat source, wherein the first heat source is disposed on the first circuit board body, and the first heat source is thermally connected to the inner path of the heat dissipation module.

\* \* \* \* \*